(12) United States Patent
Feng

(10) Patent No.: US 11,093,098 B2
(45) Date of Patent: Aug. 17, 2021

(54) TOUCH PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Xiaoliang Feng, Wuhan (CN)

( * ) Notice: Subject to any disclaimer, the term of this patent is extended or adjusted under 35 U.S.C. 154(b) by 374 days.

(21) Appl. No.: 16/344,027

(22) PCT Filed: Mar. 7, 2019

(86) PCT No.: PCT/CN2019/077345
§ 371 (c)(1),
(2) Date: Apr. 23, 2019

(87) PCT Pub. No.: WO2020/107742
PCT Pub. Date: Jun. 4, 2020

(65) Prior Publication Data
US 2021/0181876 A1   Jun. 17, 2021

(30) Foreign Application Priority Data
Nov. 27, 2018 (CN) .......................... 201811438266.9

(51) Int. Cl.
*G06F 3/045* (2006.01)
*G06F 3/041* (2006.01)
*H01L 27/32* (2006.01)

(52) U.S. Cl.
CPC ............ *G06F 3/045* (2013.01); *G06F 3/0412* (2013.01); *H01L 27/323* (2013.01)

(58) Field of Classification Search
CPC ....... G06F 3/045; G06F 3/0412; H01L 27/323
USPC .................................................. 345/173, 174
See application file for complete search history.

(56) References Cited

U.S. PATENT DOCUMENTS

2015/0346866 A1* 12/2015 Kusunoki ........... G06F 3/04166
345/174
2020/0042131 A1* 2/2020 Lee ....................... G06F 3/0414

\* cited by examiner

*Primary Examiner* — Calvin C Ma

(57) ABSTRACT

The present invention provides a touch panel. The touch panel includes: a substrate; a first sub-touch-electrode layer extended along a first direction; an anisotropic conductive layer located over the first sub-touch-electrode layer; a second sub-touch-electrode layer extended along a second direction and located over the anisotropic conductive layer, the first direction and the second direction crossing each other; and an insulating layer located over the second sub-touch-electrode layer, a display assembly located over the insulating layer.

17 Claims, 2 Drawing Sheets

TOUCH PANEL AND DISPLAY DEVICE

1. FIELD OF DISCLOSURE

The present invention relates to a field of display devices, in particular to a touch panel and a display device.

2. DESCRIPTION OF RELATED ART

With development of small and medium-sized display technology, demand for human-computer interaction is also increasing, and touch control applications have become an important medium in human-computer interaction.

According to different sensing technologies, touch panels can be categorized into four types: resistive touch, capacitive touch, optical, and acoustic wave. Current mainstream touch technology is capacitive touch. Resistive touch screens are one of the main touch technologies before the appearance of capacitive touch screens. Performance of the resistive touch screens can compete with that of the capacitive touch screens, and therefore the resistive touch screens still exist in the market.

According to different positions where a touch circuit is embedded in a liquid crystal display panel, the embedded-type touch panel can be categorized into an on-cell type, i.e., the touch circuit is disposed on a cell, and an in-cell type, i.e., the touch circuit is disposed in the cell.

With the development of display panels, touch panels have become an indispensable part of display panels, especially small and medium-sized display panels, which are widely used. Organic light emitting diode (OLED) technology has opened a new era for display screens. However, when the OLED technology is in combination with touch screens, a serious compatibility problem occurs, especially in the case of a flexible OLED screen, which is detailed as follows. Since the OLED screen requires a low temperature manufacturing process, difficulties in a manufacturing process for a capacitive touch layer increase. In addition, the touch panels have problems such as low precision in touch control and thicker displays, especially in the case of an embedded-type manufacturing process.

In summary, the conventional touch panels have the following problems: great difficulty in manufacturing the capacitive touch layer, low-precision touch control of the touch panels resulting from the embedded-type manufacturing process, and thicker displays.

SUMMARY

The present invention provides a new technical solution for a resistive touch screen. The present application provides a touch panel. By having a resistive touch screen inside the display panel, a touch control function and a display function are integrated together, and at the same time, an overall thickness of the touch panel is reduced, and high-precision touch control is realized.

In order to solve the above-mentioned problem, the present invention provides a solution as follows.

The present invention provides a touch panel, comprising:
a substrate;
a first sub-touch-electrode layer disposed on a surface of the substrate, the first sub-touch-electrode layer extended along a first direction;
an anisotropic conductive layer disposed over the first sub-touch-electrode layer, wherein when the anisotropic conductive layer is in a normal state, a plurality of conductive particles inside the anisotropic conductive layer are isolated from each other in a non-electrically conductive state, and when the anisotropic conductive layer is under pressure, the conductive particles aggregate in an electrically conductive state;
a second sub-touch-electrode layer extended along a second direction and disposed over the anisotropic conductive layer, wherein the first direction and the second direction cross each other; and
an insulating layer disposed over the sub-touch-electrode layer, a display assembly being disposed over the insulating layer.

In the touch panel of the present invention, at least one sub-touch-electrode layer is disposed between the second sub-touch-electrode layer and the insulating layer, the anisotropic conductive layer is disposed between adjacent two of the first sub-touch-electrode layer, the second sub-touch-electrode layer, and the at least one sub-touch-electrode layer.

In the touch panel of the present invention, the at least one sub-touch-electrode layer comprises a third sub-touch-electrode layer and a fourth sub-touch-electrode layer, the third sub-touch-electrode layer extended along a third direction, and the third direction is different from the first direction and the second direction.

In the touch panel of the present invention, the fourth sub-touch-electrode layer is extended along a direction different from the third direction.

In the touch panel of the present invention, the substrate is made of glass, a polyethylene terephthalate film layer, a polyimide film layer, or chip on plastic.

In the touch panel of the present invention, the anisotropic conductive layer is a nano piezoelectric unit layer, and the nano piezoelectric unit layer is made of zinc oxide.

In the touch panel of the present invention, the first sub-touch-electrode layer, the second sub-touch-electrode layer, and the at least one sub-touch-electrode layer are made of metal, graphene, or indium tin oxide.

In the touch panel of the present invention, the anisotropic conductive layer further comprises a plurality of elastic particles inside, and when the anisotropic conductive layer is in a normal state, the elastic particles cause the conductive particles inside the anisotropic conductive layer to be isolated from each other in the non-electrically conductive state.

In the touch panel of the present invention, the display assembly comprises a thin film transistor or an organic light emitting diode.

The present invention provides a touch panel. The touch panel comprises:
a substrate;
a first sub-touch-electrode layer disposed on a surface of the substrate, the first sub-touch-electrode layer being extended along a first direction;
an anisotropic conductive layer disposed over the first sub-touch-electrode layer, wherein when the anisotropic conductive layer is in a normal state, a plurality of conductive particles inside the anisotropic conductive layer are isolated from each other in a non-electrically conductive state, and when the anisotropic conductive layer is under pressure, the conductive particles aggregate in an electrically conductive state;
a second sub-touch-electrode layer extended along a second direction and disposed over the anisotropic conductive layer, wherein the first direction and the second direction cross each other; and an insulating layer disposed over the second sub-touch-electrode layer, a display assembly being disposed over the insulating layer;

wherein at least one sub-touch-electrode layer is disposed between the second sub-touch-electrode layer and the insulating layer, and the anisotropic conductive layer is disposed between adjacent two of the first sub-touch-electrode layer, the second sub-touch-electrode layer, and the at least one sub-touch-electrode layer;

wherein the substrate is made of glass, a polyethylene terephthalate film layer, a polyimide film layer, or chip on plastic (COP).

In the touch panel of the present invention, the at least one sub-touch-electrode layer comprises a third sub-touch-electrode layer and a fourth sub-touch-electrode layer, the third sub-touch-electrode layer is extended along a third direction, and the third direction is different from the first direction and the second direction.

In the touch panel of the present invention, the fourth sub-touch-electrode layer is extended in a direction different from the third direction.

In the touch panel of the present invention, the anisotropic conductive layer is a nano piezoelectric unit layer, and the nano piezoelectric unit layer is made of zinc oxide.

In the touch panel of the present invention, the first sub-touch-electrode layer, the second-touch-electrode layer, and the at least one sub-touch-electrode layer are made of metal, graphene, or indium tin oxide.

In the touch panel of the present invention, the anisotropic conductive layer further comprises a plurality of elastic particles, and when the anisotropic conductive layer is in a normal state, the elastic particles cause the conductive particles inside the anisotropic conductive layer to be isolated from each other in the non-electrically conductive state.

In the touch panel of the present invention, the display assembly comprises a thin film transistor or an organic light emitting diode.

The present invention provides a display device, comprising:
  a touch panel, the touch panel comprising:
  a substrate;
  a first sub-touch-electrode layer disposed on a surface of the substrate, the first sub-touch-electrode layer being extended along a first direction;
  an anisotropic conductive layer disposed over the first sub-touch-electrode layer, wherein when the anisotropic conductive layer is in a normal state, a plurality of conductive particles inside the anisotropic conductive layer are isolated from each other in a non-electrically conductive state, and when the anisotropic conductive layer is under a pressure, the conductive particles aggregate in an electrically conductive state;
  a second sub-touch-electrode layer extended along a second direction and disposed over the anisotropic conductive layer, wherein the first direction and the second direction cross each other; and
  an insulating layer disposed over the second sub-touch-electrode layer, a display assembly being disposed over the insulating layer.

Advantages of the present invention: The present invention provides a touch panel and a display device, and a resistive screen is disposed inside the display panel through an in-cell manufacturing process, thereby a touch control function and a display function are integrated together, and at the same time, an overall thickness of the touch panel is reduced, so high-precision touch control can be realized.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work or paying the premise.

DETAILED DESCRIPTION OF EMBODIMENTS

Embodiments of the present disclosure are described in detail with reference to the accompanying drawings as follows. Directional terms such as up/down, right/left, inner/outer, and the like may be used for the purpose of enhancing a reader's understanding about the accompanying drawings, but are not intended to be limiting. Specifically, the terminologies in the embodiments of the present disclosure are merely for the purpose of describing certain embodiments, but not intended to limit the scope of the invention. The same reference numbers are used throughout the drawings to refer to the same or similar parts.

In the description of the present application, it is to be understood that the terms "center", "longitudinal", "transverse", "length", "width", "thickness", "upper", "lower", "front", "rear", "left", "right", "vertical", "horizontal", "top", "bottom", "inside", "outside", "clockwise", "counter-clockwise", and other terms indicating directions or positional relationship with reference to the drawings are merely for a purpose of describing the present invention and simplifying descriptions, and do not indicate or imply that devices or components referred to have a specific orientation, or are constructed and operated in a specific orientation. Therefore, these terms should not be construed as limiting the application. Moreover, the terms "first" and "second" are used for descriptive purposes only and are not to be construed as indicating or implying a relative importance or implicitly indicating the number of technical elements indicated. Thus, elements defined by "first" or "second" may include one or more of the described elements either explicitly or implicitly. In the description of the present application, the meaning of "multiple" is two or more unless otherwise specified.

The invention is more specifically described in the following paragraphs by examples with reference to the accompanying drawings. Advantages and features of the present invention will become more apparent from the description and appended claims. It should be noted that the drawings are in a very simplified form and are with non-precise proportions, and the drawings are only for ease in clearly understanding the embodiments of the present application.

Figure 1:
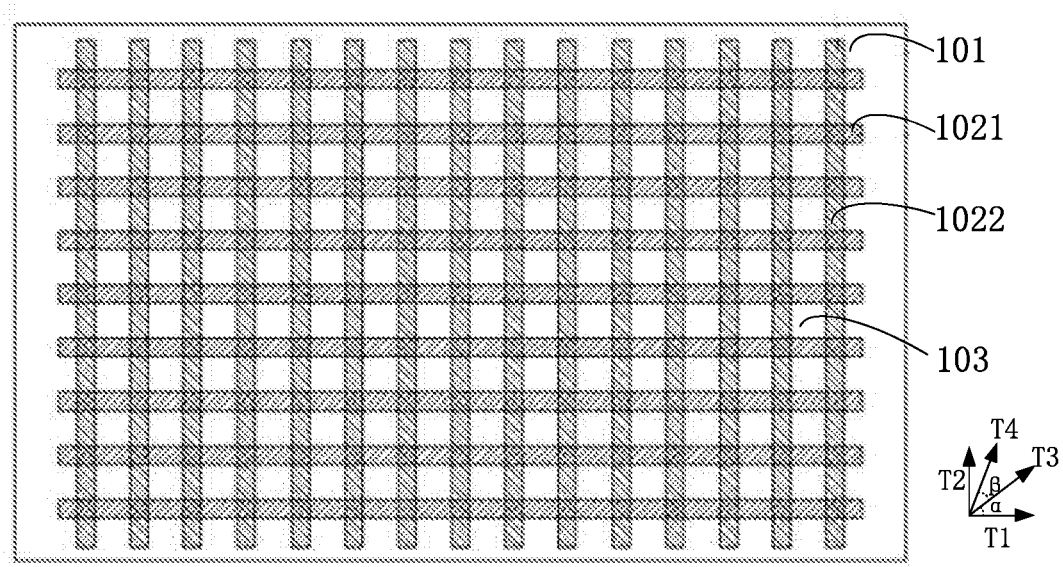
FIG. 1 is a schematic view illustrating a touch panel according to one embodiment of the present invention.

Referring to FIG. 1, the present invention provides a touch panel. The touch panel comprises:
  a substrate 101;
  a first sub-touch-electrode layer 1021 disposed on a surface of the substrate 101, the first sub-touch-electrode layer 1021 being extended along a first direction T1;

an anisotropic conductive layer 103 disposed over the first sub-touch-electrode layer 1021, wherein when the anisotropic conductive layer 103 is in a normal state, a plurality of conductive particles inside the anisotropic conductive layer are isolated from each other in a non-electrically conductive state, and when the anisotropic conductive layer 103 is under a pressure, the conductive particles are aggregated in an electrically conductive state; and a second sub-touch-electrode layer 1022 extended along a second direction T2 and disposed over the anisotropic conductive layer 103, wherein the first direction T1 and the second direction T2 cross each other.

As shown in FIG. 1, the first sub-touch-electrode layer 1021 and the second sub-touch-electrode layer 1022 cross each other. In FIG. 1, the first direction T1 is perpendicular to the second direction T2. In other words, in FIG. 1, the first sub-touch-electrode layer 1021 and the second sub-touch-electrode layer 1022 are perpendicular to each other.

Furthermore, the sub-touch-electrode layer 102 is made of metal, graphene, or indium tin oxide. The metal herein is copper (Cu) or aluminum (AL).

Moreover, at least one sub-touch-electrode layer (not illustrated) is disposed over the second sub-touch-electrode layer 1022. The anisotropic conductive layer (not illustrated) is disposed between adjacent two of the first sub-touch-electrode layer, the second sub-touch-electrode layer, and at least one sub-touch-electrode layer.

For example, a third sub-touch-electrode layer can be disposed over the second sub-touch-electrode layer 1022, the anisotropic conductive layer (not illustrated) is disposed between the third sub-touch-electrode layer and the second sub-touch-electrode layer 1022. The third sub-touch-electrode layer is extended along the third direction T3. The third direction T3 is different from the first direction T1 and the second direction T2. The first direction T1 and the second direction T2 do not coincide. For example, in FIG. 1, the third direction T3 forms an angle α with the first direction T1, and the angle α ranges from 0 degree to 360 degrees.

Similarly, a fourth sub-touch-electrode layer (not illustrated) may be disposed, and the anisotropic conductive layer is disposed between the third sub-touch-electrode layer and the fourth sub-touch-electrode layer. The fourth sub-touch-electrode layer is extended in a fourth direction T4, and the fourth direction T4 is different from the third direction T3. Furthermore, the fourth direction T4 does not coincide with the first direction T1 and the second direction T2. For example, in FIG. 1, the fourth direction T4 forms an angle β with the third direction T3, and the angle β ranges from 0 degree to 360 degrees.

Similarly, other sub-touch-electrode layers may be disposed, and the at least one sub-touch electrode layers are interlaced into a mesh form, so that the touch panel can achieve multi-touch screen control.

In the present embodiment, the touch panel comprises;
a substrate;
a first sub-touch-electrode layer disposed on a surface of the substrate, the first sub-touch-electrode layer being extended along a first direction;
an anisotropic conductive layer disposed over the first sub-touch-electrode layer, wherein when the anisotropic conductive layer is in a normal state, a plurality of conductive particles inside the anisotropic conductive layer are isolated from each other in a non-electrically conductive state, and when the anisotropic conductive layer is under a pressure, the conductive particles are aggregated in an electrically conductive state; and a second sub-touch-electrode layer extended along a second direction and disposed over the anisotropic conductive layer. This way, a resistive screen is disposed inside a display panel by manufacturing a touch control circuit through an in-cell manufacturing process, so that a touch control function and a display function are integrated, and at the same time an overall thickness of the touch panel is decreased, and high-precision touch control is realized.

Figure 2:
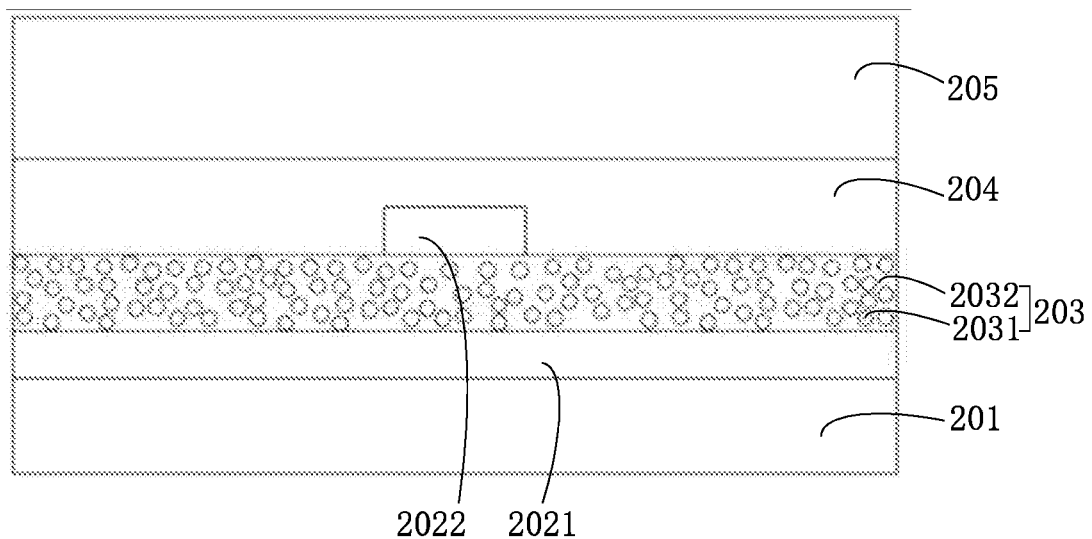
FIG. 2 is a schematic cross-sectional view illustrating the touch panel in a normal state according to one embodiment of the present invention.

Please refer to FIG. 2 which is a cross-sectional view illustrating a touch panel. The touch panel comprises a substrate 201. The substrate 201 is made of glass, a polyethylene terephthalate film layer, a polyimide (PI) film layer, or chip on plastic (COP).

A touch panel, the touch panel comprising:
a substrate 201;
a first sub-touch-electrode layer 2021 disposed on a surface of the substrate 201;
an anisotropic conductive layer 203 disposed over the first sub-touch-electrode layer 2021, the anisotropic conductive layer 203 consisting of irregularly arranged conductive particles 2031 inside, the anisotropic conductive layer 203 being internally provided with elastic particles 2032 made of foam or sponge, wherein when the anisotropic conductive layer 203 is in a normal state, the elastic particles 2032 cause the conductive particles 2031 inside the anisotropic conductive layer 203 to be isolated from each other in a non-electrically conductive state, so that the touch panel is in an OFF state (an electrically disconnected state); and
a second sub-touch-electrode layer 2022 disposed over the anisotropic conductive layer 203.

Furthermore, the first sub-touch-electrode layer 2021 and the second sub-touch-electrode layer 2022 are made in a same process and are made of metal, graphene, or indium tin oxide (ITO).

Referring to FIG. 2, when the anisotropic conductive layer 203 is in the normal state, the conductive particles 2031 inside the anisotropic conductive layer 203 are isolated from each other in the non-electrically conductive state. At this point, the anisotropic conductive layer 203 is not electrically connected to the sub-touch electrode layer 202, and the touch panel is in the OFF state.

Furthermore, the anisotropic conductive layer 203 is connected to the first sub-touch-electrode layer 2021 and the second sub-touch-electrode layer 2022 through an optically clear adhesive (OCA) or other polymer adhesive layer.

Moreover, the anisotropic conductive layer 203 is constituted by a nano piezoelectric unit layer, and the nano piezoelectric unit layer is made of zinc oxide.

An insulating layer 204 is disposed over the second sub-touch-electrode layer 2022. The insulating layer 204 serves as a planarization (PLN) layer of the touch panel.

The touch panel further includes a display assembly 205 disposed over the insulating layer 204. The display assembly 205 includes a thin film transistor (TFT) and an organic light emitting diode (OLED). The display assembly 205 further includes one of a liquid crystal display (LCD) and a low temperature poly-silicon (LTPS) display.

The present embodiment simply provides an example using the first and second sub-touch-electrode layers for achieving single-touch operations, and multiple touch-electrode layers can also be used in a similar way, detailed as follows. At least one sub-touch-electrode layer is disposed between the second sub-touch-electrode layer 2022 and the insulating layer 204, and the anisotropic conductive layer 203 is disposed between adjacent two of the first sub-touch-electrode layer 2021, the second sub-touch-electrode layer 2022, and at least one sub-touch-electrode layer.

In detail, a third sub-touch-electrode layer can be disposed between the second sub-touch-electrode layer 2022 and the insulating layer 204. The anisotropic conductive layer 203 is disposed between adjacent the third sub-touch-electrode layer and the second sub-touch-electrode layer 2022. Similarly, a fourth sub-touch-electrode layer and succeeding sub-touch-electrode layers can be disposed in the same way, and the at least one sub-touch-electrode layer is interlaced into a mesh form, so that the touch panel can realize multi-touch operations.

Figure 3:
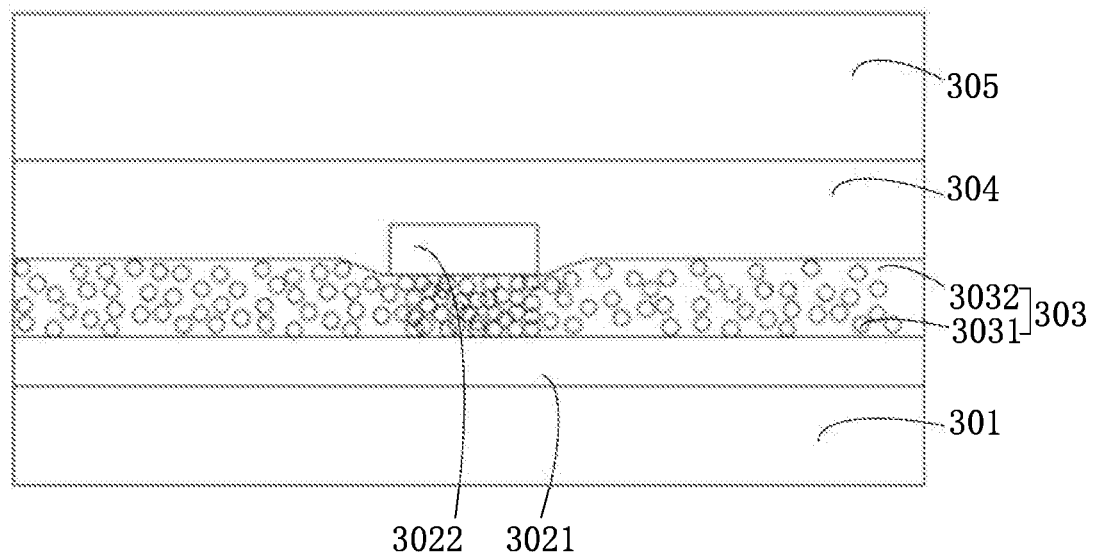
FIG. 3 is a schematic cross-sectional view illustrating the touch panel under pressure according to one embodiment of the present invention.

Please refer to FIG. 3, which is a schematic structural view illustrating that a touch panel is under a pressure. The touch panel comprises:

a substrate 301;

a first sub-touch-electrode layer 3021 disposed on a surface of the substrate 301;

an anisotropic conductive layer 303 disposed over the first sub-touch-electrode layer 3021, wherein when the anisotropic conductive layer 303 is in a normal state, a plurality of conductive particles 3031 inside the anisotropic conductive layer 303 are isolated from each other in a non-electrically conductive and an electrically insulated state, and when the anisotropic conductive layer 303 receives a pressure from a second sub-touch-electrode layer 3022 disposed above, the conductive particles 3032 inside the anisotropic conductive layer are aggregated in an electrically conductive state;

the second sub-touch-electrode layer 3022 disposed over the anisotropic conductive layer 303; and an insulating layer 304 disposed over the second sub-touch-electrode layer 3022, a display assembly 305 being disposed over the insulating layer 304.

The first sub-touch-electrode layer 3021, the second sub-touch-electrode layer 3022, and the anisotropic conductive layer 303 together constitute a resistive touch layer. When external pressure is applied to a resistive touch layer 30, the second sub-touch-electrode layer 3022 presses on the anisotropic conductive layer 303. The elastic particles 3032 inside the anisotropic conductive layer 303 are pushed in a direction of the pressure. Therefore, the conductive particles 3031 inside the anisotropic conductive layer 303 are densely accumulated and aggregated, thus causing the conductive particles 3031 to be in the electrically-conductive state in a vertical direction of the resistive touch layer 30, so that the first sub-touch-electrode layer 3021 and the second sub-touch-electrode layer 3022 are electrically connected in a position where the pressure is applied to thereby electrically connect the display assembly 305.

In the present embodiment, since the anisotropic conductive layer 303 is disposed between the first sub-touch-electrode layer 3021 and the second sub-touch-electrode layer 3022, a resistive screen is integrated into the inside of the display. The problem of noise interference caused by the use of a capacitive screen is avoided. The anisotropic conductive layer 303 has higher sensitivity to pressure applied for touch control operations, so that the touch panel can realize high-precision touch control. Further, the touch panel and the display device provided in the present invention can be used in operations such as paintings that require relatively high precision.

In the present embodiment, operating principles of touch control are based on resistance, so touch operations can be fulfilled with any touch tools without limitations. In other words, touch operations can be performed in any way which can exert touch pressure, even gentle one; and the densely distributed touch electrodes can achieve high-precision, accurate-detection touch operations.

Because the touch electrode layer is disposed under the display assembly, configuration of the touch electrode layer is not restricted or dependent by the position of the display assembly, and manufacturing is easy and convenient.

Furthermore, the present invention provides a display device. The display device comprises the touch panel of the present embodiment.

The display device comprises a touch panel, wherein the touch panel comprises:

a substrate;

a first sub-touch-electrode layer disposed on a surface of the substrate, the first sub-touch-electrode layer being extended along a first direction;

an anisotropic conductive layer disposed over the first sub-touch-electrode layer, wherein when the anisotropic conductive layer is in a normal state, a plurality of conductive particles inside the anisotropic conductive layer are isolated from each other in a non-electrically conductive state, and when the anisotropic conductive layer is under a pressure, the conductive particles are aggregated in an electrically conductive state;

a second sub-touch-electrode layer extended along a second direction and disposed over the anisotropic conductive layer, wherein the first direction and the second direction cross each other; and an insulating layer disposed over the second sub-touch-electrode layer, a display assembly being disposed over the insulating layer.

Advantages of the present invention:

First, the resistive screen is embedded in the touch panel to solve a problem of noise interference that the capacitive screen cannot avoid.

Second, the touch panel no longer relies on a capacitor to obtain signals, users can achieve touch operations in any touch manner.

Third, high-precision touch control can be realized, and the touch panel and the display device can be used for operations which require relatively high precision, such as painting.

Fourth, production costs are low, and the production is convenient and not affected by a manufacturing process of the display assembly.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A touch panel, comprising:
a substrate;
a first sub-touch-electrode layer disposed on a surface of the substrate, the first sub-touch-electrode layer extended along a first direction;
an anisotropic conductive layer disposed over the first sub-touch-electrode layer, wherein when the anisotropic conductive layer is in a normal state, a plurality of conductive particles inside the anisotropic conductive layer are isolated from each other in a non-electrically conductive state, and when the anisotropic conductive layer is under pressure, the conductive particles aggregate in an electrically conductive state;
a second sub-touch-electrode layer extended along a second direction and disposed over the anisotropic conductive layer, wherein the first direction and the second direction cross each other; and an insulating layer disposed over the second sub-touch-electrode layer, a display assembly being disposed over the insulating layer;

wherein at least one sub-touch-electrode layer is disposed between the second sub-touch-electrode layer and the insulating layer, the anisotropic conductive layer is disposed between adjacent two of the first sub-touch-electrode layer, the second sub-touch-electrode layer, and the at least one sub-touch-electrode layer;

wherein the substrate is made of glass, a polyethylene terephthalate film layer, a polyimide film layer, or chip on plastic.

2. The touch panel according to claim 1, wherein the at least one sub-touch-electrode layer comprises a third sub-touch-electrode layer and a fourth sub-touch-electrode layer, the third sub-touch-electrode layer extended along a third direction, and the third direction is different from the first direction and the second direction.

3. The touch panel according to claim 2, wherein the fourth sub-touch-electrode layer is extended along a direction different from the third direction.

4. The touch panel according to claim 1, wherein the anisotropic conductive layer is a nano piezoelectric unit layer, and the nano piezoelectric unit layer is made of zinc oxide.

5. The touch panel according to claim 1, wherein the first sub-touch-electrode layer, the second sub-touch-electrode layer, and the at least one sub-touch-electrode layer are made of metal, graphene, or indium tin oxide.

6. The touch panel according to claim 1, wherein the anisotropic conductive layer further comprises a plurality of elastic particles inside, and when the anisotropic conductive layer is in a normal state, the elastic particles cause the conductive particles inside the anisotropic conductive layer to be isolated from each other in the non-electrically conductive state.

7. The touch panel according to claim 1, wherein the display assembly comprises a thin film transistor or an organic light emitting diode.

8. A touch panel, comprising:
a substrate;
a first sub-touch-electrode layer disposed on a surface of the substrate, the first sub-touch-electrode layer being extended along a first direction;
an anisotropic conductive layer disposed over the first sub-touch-electrode layer, wherein when the anisotropic conductive layer is in a normal state, a plurality of conductive particles inside the anisotropic conductive layer are isolated from each other in a non-electrically conductive state, and when the anisotropic conductive layer is under pressure, the conductive particles aggregate in an electrically conductive state;
a second sub-touch-electrode layer extended along a second direction and disposed over the anisotropic conductive layer, wherein the first direction and the second direction cross each other; and
an insulating layer disposed over the second sub-touch-electrode layer, a display assembly being disposed over the insulating layer.

9. The touch panel according to claim 8, wherein at least one sub-touch-electrode layer is disposed between the second sub-touch-electrode layer and the insulating layer, and the anisotropic conductive layer is disposed between adjacent two of the first sub-touch-electrode layer, the second sub-touch-electrode layer, and the at least one sub-touch-electrode layer.

10. The touch panel according to claim 9, wherein the at least one sub-touch-electrode layer comprises a third sub-touch-electrode layer and a fourth sub-touch-electrode layer, the third sub-touch-electrode layer is extended along a third direction, and the third direction is different from the first direction and the second direction.

11. The touch panel according to claim 10, wherein the fourth sub-touch-electrode layer is extended in a direction different from the third direction.

12. The touch panel according to claim 8, wherein the substrate is made of glass, a polyethylene terephthalate film layer, a polyimide film layer, or chip on plastic.

13. The touch panel according to claim 8, the anisotropic conductive layer is a nano piezoelectric unit layer, and the nano piezoelectric unit layer is made of zinc oxide.

14. The touch panel according to claim 8, wherein the first sub-touch-electrode layer and the second sub-touch-electrode layer are made of metal, graphene, or indium tin oxide.

15. The touch panel according to claim 8, wherein the anisotropic conductive layer further comprises a plurality of elastic particles, and when the anisotropic conductive layer is in a normal state, the elastic particles cause the conductive particles inside the anisotropic conductive layer to be isolated from each other in the non-electrically conductive state.

16. The touch panel according to claim 8, wherein the display assembly comprises a thin film transistor or an organic light emitting diode.

17. A display device, comprising:
a touch panel, the touch panel comprising:
a substrate;
a first sub-touch-electrode layer disposed on a surface of the substrate, the first sub-touch-electrode layer being extended along a first direction;
an anisotropic conductive layer disposed over the first sub-touch-electrode layer, wherein when the anisotropic conductive layer is in a normal state, a plurality of conductive particles inside the anisotropic conductive layer are isolated from each other in a non-electrically conductive state, and when the anisotropic conductive layer is under pressure, the conductive particles are aggregated in an electrically conductive state;
a second sub-touch-electrode layer extended along a second direction and disposed over the anisotropic conductive layer, wherein the first direction and the second direction cross each other; and
an insulating layer disposed over the second sub-touch-electrode layer, a display assembly being disposed over the insulating layer.

* * * * *